United States Patent
Lein et al.

(10) Patent No.: US 6,361,854 B2
(45) Date of Patent: *Mar. 26, 2002

(54) RADIATION CURED ISLAND COATING SYSTEM

(75) Inventors: Maureen M. Lein, Chester, NH (US); Ellen Lord, So. Berwick, ME (US); Richard C. Eisfeller, Greenland; Mark E. Dukeshire, New Durham, both of NH (US); Richard W. Finch, Northford, CT (US); Alfred T. Poliquin, Dover, NH (US); Gerard L. Vachon, Somersworth, NH (US); John B. Clark, Stratham, NH (US); Stephen P. McLaughlin, Bloomfield Hills, MI (US); Robert D. Sparling, Madbury, NH (US)

(73) Assignee: Textron Automotive Company, Troy, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/765,987

(22) Filed: Jan. 19, 2001

Related U.S. Application Data

(63) Continuation of application No. 09/431,609, filed on Nov. 1, 1999, now Pat. No. 6,238,776, which is a continuation of application No. 08/769,013, filed on Dec. 18, 1996, now Pat. No. 5,985,418, which is a division of application No. 08/426,101, filed on Apr. 21, 1995, now abandoned, which is a continuation-in-part of application No. 08/248,649, filed on May 25, 1994, now Pat. No. 5,464,661.

(51) Int. Cl.$^7$ ............................................... B32B 3/00
(52) U.S. Cl. ........................ 428/195; 428/203; 428/458
(58) Field of Search ................................ 428/195, 201, 428/203, 457, 458

(56) References Cited

U.S. PATENT DOCUMENTS

| | | | |
|---|---|---|---|
| 3,118,781 A | 1/1964 | Downing | 117/33.3 |
| 3,914,472 A | 10/1975 | Nakanishi et al. | 427/250 |
| 4,101,698 A | 7/1978 | Dunning et al. | 428/31 |
| 4,131,530 A | 12/1978 | Blum et al. | 204/192 |
| 4,188,358 A | 2/1980 | Withoos et al. | 264/255 |
| 4,211,822 A | 7/1980 | Kurfman et al. | 428/412 |
| 4,215,170 A | 7/1980 | Oliva | 428/328 |
| 4,407,871 A | 10/1983 | Eisfeller | 428/31 |
| 4,431,711 A | 2/1984 | Eisfeller | 428/31 |
| 4,713,143 A | 12/1987 | Eisfeller | 156/655 |
| 4,931,366 A | 6/1990 | Mullaney, Jr. | 428/622 |
| 5,284,679 A | 2/1994 | Eisfeller et al. | 427/240 |
| 5,290,625 A | 3/1994 | Eisfeller et al. | 428/216 |
| 5,320,869 A | 6/1994 | Eisfeller et al. | 427/250 |

FOREIGN PATENT DOCUMENTS

| | | | |
|---|---|---|---|
| EP | 0 358 445 | 3/1990 | B32B/27/32 |
| EP | 0 392 082 A3 | 10/1990 | H01M/4/00 |
| EP | 0 616 906 A3 | 9/1994 | B44C/5/04 |

*Primary Examiner*—Elizabeth Evans
(74) *Attorney, Agent, or Firm*—Hayes, Soloway, Hennessey, Grossman & Hage, P.C.

(57) ABSTRACT

A process for manufacturing a metallized substrate using the island coating method, includes depositing a coating layer containing a radiation curable non-volatile film former. The coated part is then vacuum metallized to form the metal islands of the present invention. A layer of clear resinous protective dielectric topcoat containing a radiation curable non-volatile film former is then deposited to completely cover the layer of metal islands while maintaining the aesthetic properties of the metallizing island coating system at a reduced cost and with minimal variability among parts.

21 Claims, No Drawings

A # RADIATION CURED ISLAND COATING SYSTEM

CROSS-REFERENCED RELATED APPLICATIONS

This patent application is a continuation of U.S. patent application Ser. No. 09/431,609, filed Nov. 1, 1999, now U.S. Pat. No. 6,238,776 issued Nov. 1, 1999 U.S. patent application Ser. No. 09/431,609 is a continuation of U.S. patent application Ser. No. 08/769,013, filed Dec. 18, 1996, now U.S. Pat. No. 5,985,418 which is a divisional of U.S. patent application Ser. No. 08/426,101, filed Apr. 21, 1995, now abandoned which is a continuation-in-part of U.S. patent application Ser. No. 08/248,649 filed May 25, 1994, now U.S. Pat. No. 5,464,661.

TECHNICAL FIELD

This invention pertains to vacuum deposition of amphoteric materials.

BACKGROUND OF THE INVENTION

Vacuum metallizing of plastic and similar dielectric substrates is disclosed in various forms including U.S. Patents:

| | |
|---|---|
| 2,992,125 | Fustier |
| 2,993,806 | Fisher |
| 3,118,781 | Downing |
| 3,914,472 | Nakanishi |
| 4,101,698 | Dunning |
| 4,131,530 | Blum |
| 4,211,822 | Kurfman |
| 4,215,170 | Oliva |

In addition, two reference books are:

*Thin Film Phenomena*, Kasturi L. Chopra, Robert E. Kreiger Publishing Company, Huntington, N.Y., 1979. pp. 163–189.

*Handbook of Thin Film Technology*, Leon I. Maissel and Reinhard Glang, McGraw-Hill Book Company, New York, N.Y., 1970., pp. 8–32 to 8–43.

U.S. Pat. Nos. 4,407,871, 4,431,711 and 4,713,143, assigned to assignee of the present invention and incorporated herein by reference, relate to metallizing of plastic articles and more particularly to the structure and spacing of discrete metal islands used to metallize rather than a continuous metal film. The metallizing is performed utilizing the island coating system as detailed in the aforesaid patents. The system includes generally spray depositing sequentially a primer coating layer, a basecoat coating layer, a metallizing layer and a topcoat layer. As disclosed in the above referenced patents, the coating layers contain non-volatile film forming polymers, generally in the range of 10–30% requiring flash time of 20 minutes at ambient temperature and cure times of approximately 30 minutes at 260° F. between application of layers.

In addition to proper deposition of the coating layers, the appearance and performance of the commercial product, the conductivity of the metal layer, the corrosion resistance of the metal layer and/or the adhesion of the top coat all relate to the structure and spacing of the islands. The above referenced patents provide further teachings related to nucleation and film growth to the desired island structure and spacing that achieves these ends.

In U.S. Pat. No. 5,290,625, assigned to the assignee of the present invention and incorporated herein by reference, the above process is applied to aluminum parts. In a co-pending application, U.S. Pat. No. 5,468,518, assigned to the assignee of the present invention and incorporated herein by reference, the coating layers are modified to form a combined primer/basecoat layer. The underlying combined primer/basecoat can include a pigment to provide a colored metallic appearance as disclosed in U.S Pat. No. 5,320,869 issued Jun. 14, 1994 and assigned to assignee of the present invention and incorporated herein by reference. In another co-pending application, U.S. Pat. No. 5,464,661, assigned to the assignee of the present invention and incorporated herein by reference, the technology for coating layer deposition is improved to allow film builds of 1.5 to 2.0 mils, eliminating significant coating irregularities.

The current island coating system spray deposits the polymeric constituents of the primer layer, basecoat layer and topcoat layer in organic solvent carriers such as glycol ethers, glycolether acetates, aromatic hydrocarbons and dibasic esters. These solvent carriers pose a waste disposal problem increasing the cost of production significantly, a flammability hazard, as well as requiring significant flash and cure times. If the organic solvents could be eliminated, while still maintaining the aesthetic properties of the metallized appearance, significant savings in time and therefore increased production, improved safety, as well as ease of waste disposal would be attained. Additionally, with the elimination of organic solvents the range of substrates that can be metallized could be increased.

In general, the step of spray depositing is done for batch processing while the parts are being rotated as described in U.S. Pat. No. 5,284,679 issued Feb. 8, 1994 and assigned to the assignee of the present invention, and incorporated herein by reference. However, the use of rotation is not practical when dealing with substrates that are thin sheets such as thin extruded polymers, cellulose based materials and textiles. These thin gauge sheets or sheetstocks require different handling and for high speed production it would be useful to be able to have continuous in-line processing.

Apparel designers would find it advantageous to have a metallized sheetstock made from various materials such as polymers, vinyls, cellulose based materials and textiles, that are flexible, washable, formable, and die cutable. Currently available metallic trims are generally either not truly metallic in appearance, or upon washing and wetting lose metallic luster or cannot be washed at all. Further, it would be advantageous to have materials with a metallized appearance that can be "ironed on", i.e. a thermal bonding adhesive, in addition to "stitched on". As one example, athletic shoe manufacturers have a perceived need to individualize their products with unique, identifiable features, as for example lights that are present on one brand of athletic shoes. Metallic trim would be useful in creating such identifiable features.

It would be useful to have thin polymer extrusion metallic finish products that can be cut on high speed electrically resisted die blades without arcing. Further it would be useful to be able to utilize such materials as exterior trim without corrosion and which can be used for in-mold decorating and which have the proper reflectivity or depth of image.

SUMMARY OF THE INVENTION AND ADVANTAGES

According to the present invention, a process for manufacturing a metallized substrate using the island coating system, includes depositing a first coating layer containing a radiation curable non-volatile film former. The coated substrate is then vacuum metallized to form the metal islands of the present invention and a layer of clear resinous protective dielectric topcoat containing a radiation curable non-volatile film former is deposited to completely cover the layer of metal islands while maintaining the aesthetic properties of the metallizing island coating system at a reduced cost and with minimal variability.

The substrate can be formed parts of various polymers or metals or the substrate can be a sheetstock made from materials such as a thin gauge extruded polymer, vinyl, textile or cellulose based material.

DETAILED DESCRIPTION OF THE PREFERRED EMBODIMENT

The present invention provides a process of manufacturing substrates/parts, and the manufactured parts/substrates themselves, that have a metallized appearance, that reduces the amount of organic wastes and production time as well as allowing continuous in-line processing of sheetstock utilizing the island coating system.

The part can be made from a substrate material selected from the group comprising crystalline and/or amorphous thermoplastic elastomers such as thermoplastic urethanes, thermoplastic urethane alloys, polyester alloys, thermoplastic olefins, polyamide alloys and metals such as aluminum, magnesium and steel.

Further the substrate material can be in a thin gauge sheet form, i.e. sheetstock. The sheetstock has a thickness range of from 0.002 inches to 2 inches with 0.002 to 0.5 inches being the preferred range. The sheetstock can also include textiles such as, but not limited to, cotton, denim, canvas as well as vinyls and cellulose based materials including rayon.

In-line processing refers to a process herein the material being treated is moved from one holding means and taken up by another and while moving between is treated by the process. For example, reel-to-reel processing would be one means of in-line processing.

The island coating system is then applied as taught in U.S. Pat. Nos. 4,407,871, 4,431,711, 4,713,143, 5,290,625 with the improvements disclosed in the present invention. The island coating system includes generally as a first coating layer either a combined primer/basecoat layer, or separately applied primer and basecoat layers, a metallizing layer and an encapsulating topcoat layer. The prior art teaches that each coating layer contains film forming polymers as disclosed in the above referenced patents and patent applications.

The coatings of the present invention contain oligomers which can be classified as film forming polymers or resins in standard coating technology. The oligomers are blended with monomers which are low viscosity and are considered reactive diluents providing viscosity reduction to the coating and they react with oligomers when exposed to UV light. A photoinitiator is also required.

Two publications which provide general background information on radiation curing are:

*Cationic Radiation Curing*, J. Koleske, Federation Series on Coatings Technology, Federation of Societies for Coating Technology, June, 1991; and

*Radiation Cured Coatings*, J. Costanza et al., Federation Series on Coatings Technology, Federation of Societies for Coating Technology, June, 1986.

In the coatings of present invention, the film forming polymers are radiation curable film formers. The radiation curable non-volatile film former is selected from the group consisting of melamine acrylate, urethane acrylate, epoxy acrylate, acrylic acrylate and polyester acrylate.

With the utilization of radiation curable film formers, no organic solvents are required in the present invention. Flammability hazards are eliminated as well as wastes. The present invention provides for the exposure to the radiation to occur outside the coating room, therefore the excess coating fluid can be collected and recycled for reuse.

The formulation of each coating layer is therefore:
Primer
  0–5% pigment
  30–90% radiation curable film former
  1–5% photoinitiator
  2–70% monomers
Basecoat
  30–90% radiation curable film former
  1–5% photoinitiator
  2–70% monomers
Combined Primer/basecoat
  0–5% pigment
  30–90% radiation curable film former
  1–5% photoinitiator
  2–70% monomers
Topcoat
  0–3% UV absorber
  30–90% radiation curable film former
  1–5% photoinitiator
  2–70% monomers The photoinitiator is selected from the group consisting of phenylketones, benzophenone, diazonium salts, diaryliodonium salts, triarylsulphonium salts, benzoin ethers, thioxantones and oxime esters.

The pigment can be black or other colors such as red, green, yellow or purple. In the preferred embodiment a black pigment is used.

In the practice of the improvements of the present invention, the primer, basecoat and topcoat layers (or coatings) can be applied utilizing spray technology, generally high volume, low pressure spray equipment to atomize the coatings. The coatings may be heated (100°–120° F.) to assist with coating flow out. The coatings are applied while the parts are at ambient or elevated temperature (20°–150° F.). If preformed parts are being coated, the parts can be done in "batch" and in the preferred embodiment while the parts are rotating.

If the substrate is a sheetstock, in-line processing can be used for high volume processing utilizing the present invention. For this process coatings can be applied with spray technology but also roller or knife deposition as is known in the art can be used. D. Satas, *Web Processing & Converting Technology & Equipment*, VanNostrand, Reinhold, N.Y., 1984; Kallendorf, C. F., ed. *Radiation Curing Primer I: Inks Coatings & Adhesives*, Rad Tech International Park America, 60 revere Drive, Suite 500, Northbrook, Ill. 60062, 1990. For low volume applications individual sheets can be processed using either current metallization procedures or the present invention.

Generally only one side of the sheetstock is metallized, but both sides can be metallized. The one side metallized can be on the first surface, e.g., the surface of the substrate that faces in the direction of the light impinging on the substrate carrying the discontinuous layer of metal. In this case the light impinging on the surface of the substrate passes through the discontinuous layer of metal first with part of the light being reflected back from the metal islands and not reaching the surface.

Alternatively the metallizing can be on the substrate surface opposite the first surface. In this case the opposite surface, or second surface, has the discontinuous layer of metal formed thereon and the light passes through the substrate (either transparent or translucent material) before it is reflected back through the substrate again from the discontinuous layer of metal.

The coatings in the present invention do not require a flash time since there are no solvents to evaporate. The coatings are cured by ultraviolet radiation from a suitable source such as an ultraviolet lamp for less than five minutes. The coating thicknesses are between 0.5 and 2.0 mils for each coating as set forth in the prior art with 1.5 mil being the preferred thickness.

Because of the elimination of the flash step and the significant reduction in cure time compared to the prior art island coating system, the time to produce metallized parts is reduced. The efficiency of the production line making metallized parts is increased by at least 60% and continuous in-line processing of sheetstock can be undertaken.

In a second embodiment, liquid inorganic carriers such as $CO_2$ can be substituted for part of the organic solvent carriers as marketed by Union Carbide in their UNICARB® system. Applicant has utilized this system and in the practice of the present invention some organic solvents are necessary to maintain proper flow rate and consistency.

In a further embodiment, a hardcoat layer is applied on the topcoat layer. The hardcoat layer can be applied to improve scratch resistance. This hardcoat layer can be applied to improve scratch resistance where flexibility is not required. This hardcoat layer can be selected from the group consisting thermally cured silicone coatings and UV cured acrylate and methacrylate coatings.

The present invention provides thin extrusion polymer sheetstock with a metallic finish. These thin extrusion polymers have wide application in exterior and interior trims, particularly in the automotive industry. In the prior art sheetstock with a continuous, non-island, metallized layer when cut on high speed electrically resisted die blades would arc. However, metallized sheetstock prepared with the island coating system can be die cut since no arcing can occur because the metal layer is not conductive. In general for these applications, the sheetstock is selected from crystalline and/or amorphous thermoplastic elastomers such as thermoplastic urethanes, thermoplastic urethane alloys, polyester alloys, thermoplastic olefins, polyamide alloys as well as vinyls, textiles and cellulose based materials.

The present invention provides metallized thin extruded elastomeric plastic sheets, 0.002 to 0.010 inches in thickness, which can be used effectively in trim applications without crinkle. Because of the flexible nature of the island coating these sheets can be stretched over complex geometric shapes as well as be "molded in" to complex shaped products to eliminate the need for an adhesive. In second surface applications, depth of image (DOI) provides an exact image as does chrome without the performance problems of chrome.

The present invention also provides a metallized substrate which is flexible, washable, and can be either attached with adhesive or stitched to an appropriate object and in particular to wearing apparel. The metallization can be performed either as taught by U.S. Pat. Nos. 4,407,871, 4,431,711 and 4,713,143, or with the improvements of the present invention. The object can be clothes, shoes or the like.

These improvements allow the substrate to be materials which should not be exposed to organic solvents such as textiles and continuous in-line processing, i.e. metallizing, can be used to manufacture the substrate. The substrate for use in apparel and trims is generally selected from the group consisting of polymers, generally a thermoplastic urethane (TPU), vinyls, cellulose derived materials such as paper, wood and rayon, and textiles such as cotton, wool and silk. The substrate can be in any shape, but in the preferred embodiment it is in sheet form so that it can be die cut into the appropriate shape to be applied to apparel. Further, in another preferred embodiment the substrate can be laundered using standard procedures and can go through the drying cycle of a dryer. Polyester elastomer substrates such as Hytrell and polyurethane elastomer substrates such as Rynitel have been used in the present invention as well as thermoplastic polyester sheetstock such as Estanel. The substrate can be formed into trims for apparel or apparel trim itself can be processed with the present invention. Further articles of clothing themselves, such as shoes, can also be metallized with the present invention.

Additional appearance modifications can be achieved by either mechanically abrading the metal layer in random or structured patterns prior to topcoating. "Splattering" the metal layer with 1% nitric, sulfuric or hydrochloric acid prior to topcoating also provides a mottled visual effect.

The present invention also provides the advantages that different pigments can be added to the basecoats or dyes added to the topcoat to produce different colored appearances. Alternatively, the substrate itself can have color as set forth in the '869 Patent. Also, secondary accents can be achieved by painting directly over the topcoat. Additionally, ink transfers in a variety of patterns can also be applied in order to produce a variety of looks, as for example snakeskin and geometric patterns.

The process provides metallized sheetstock which can be formed into trim which are metallic in appearance and are flexible, washable and formable into sheets for die cutting. The process also provides for the application of the island coating system on both cellulose derived and textile materials.

The invention will now be described by way of the following examples with it being understood that other advantages and a more complete understanding of the invention will be apparent to those skilled in the art from the detailed description of the invention.

EXAMPLE 1

Four preformed parts for automobiles were metallized utilizing the island coating system as in the present invention. The radiation curable combination primer/basecoat was spray coated and then cured by a 1 minute exposure to a UV lamp. The parts were rotated during the exposure. The parts were then vacuum metallized with indium and a radiation curable clear topcoat was then spray coated onto the part. Curing was by a 1 minute exposure to a UV lamp. The parts were rotated during the exposure.

| Part | Material | Appearance |
| --- | --- | --- |
| Headlight Reflector | Acrylonitrile butadiene styrene | Bright, smooth reflective |
| Doorpull | Glass filled Nylon | Bright, smooth reflective |
| Wheel | Aluminum | Bright, smooth reflective |
| Radiator Grille | Thermoplastic Urethane | Bright, smooth reflective |

The parts all had a metallized appearance that was within acceptable parameters. Diffuse reflectance was within 45–65 units, distinctness of image (DOI) was >90 units, gloss was >100 units and haze was <23 units for each part.

EXAMPLE 2

Two molded footwear heel plates and two pieces of TPU sheetstock were metallized. The samples were washed in a home washing machine and dried in a home dryer through ten cycles over a period of several days. Generally the washing cycles included a warm wash and a cold rinse with a commercial laundry detergent and non-chlorine bleach. The dryer was set on an automatic cycle which is approximately 35–40 minutes.

The samples were then evaluated and found to have no loss of flexibility, no change in color and no coating delamination.

Throughout this application various publications are referenced by citation or patent number. The disclosures of these publications in their entireties are hereby incorporated by reference into this application in order to more fully describe the state of the art to which this invention pertains.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, the invention may be practiced otherwise than as specifically described.

What is claimed is:

1. A plastic sheet comprising an island coating system forming a discontinuous metal layer on at least one of a first surface and a second surface of said sheet.

2. The plastic sheet according to claim 1 further comprising a thickness, the thickness in the range of 0.002 to 2.0 inches.

3. The plastic sheet according to claim 1 further comprising a thickness, the thickness in the range of 0.002 to 0.5 inches.

4. The plastic sheet according to claim 1 further comprising a thickness, the thickness in the range of 0.002 to 0.010 inches.

5. The plastic sheet according to claim 1 further characterized by said sheet being transparent or translucent.

6. The plastic sheet according to claim 1 further comprising an island coating system forming a discontinuous metal layer on both the first surface and the second surface of said sheet.

7. A metallized substrate comprising:
   a substrate, the substrate comprising a sheet, the sheet having a first surface, a second surface opposite the first surface;
   a discontinuous layer of metal on at least one of the sheet first surface or the sheet second surface;
   a top layer covering the discontinuous metal layer.

8. The metallized substrate according to claim 7 wherein the sheet comprises a polymer.

9. The metallized substrate according to claim 7 wherein the sheet further comprises a thickness, the thickness in the range of 0.002 to 2.0 inches.

10. The metallized substrate according to claim 7 wherein the sheet further comprises a thickness, the thickness in the range of 0.002 to 0.5 inches.

11. The metallized substrate according to claim 7 wherein the sheet further comprises a thickness, the thickness in the range of 0.002 to 0.010 inches.

12. The metallized substrate according to claim 8 wherein the polymer sheet is extruded.

13. The metallized substrate according to claim 5 wherein the sheet is produced using in-line processing.

14. A metallized substrate comprising:
   a plastic sheet, the plastic sheet having a metallic finish, the metallic finish provided by discontinuous layer of metal on at least one of the substrate.

15. The metallized substrate of claim 14 wherein the metallized substrate can be cut on electrically resisted die blades.

16. The metallized substrate of claim 14 wherein the metallized substrate may be molded in to a shaped product.

17. The metallized substrate of claim 14 wherein the metallized substrate may be used for in-mold decorating.

18. The metallized substrate of claim 14 wherein the metallized substrate has a distinctness of image greater than 90 units.

19. The metallized substrate of claim 14 wherein the metallized substrate has a gloss greater than 100 units.

20. The metallized substrate of claim 14 wherein the metallized substrate has haze less than 23 units.

21. The metallized substrate of claim 14 wherein the metallized substrate has a diffuse reflectance within 45–65 units.

* * * * *